United States Patent [19]

Krum et al.

[11] Patent Number: 4,766,479
[45] Date of Patent: Aug. 23, 1988

[54] LOW RESISTANCE ELECTRICAL INTERCONNECTION FOR SYNCHRONOUS RECTIFIERS

[75] Inventors: Alvin L. Krum; Charles W. Conklin, both of Huntington Beach, Calif.

[73] Assignee: Hughes Aircraft Company, Los Angeles, Calif.

[21] Appl. No.: 918,186

[22] Filed: Oct. 14, 1986

[51] Int. Cl.[4] ............................................. H01L 23/02
[52] U.S. Cl. ......................................... 357/74; 357/41
[58] Field of Search .................... 357/74, 72, 68, 40, 357/41

[56] References Cited

U.S. PATENT DOCUMENTS 3,786,375  1/1974  Sato et al. ............................ 357/74

FOREIGN PATENT DOCUMENTS 0166633  1/1974  European Pat. Off. .
0114760  8/1984  European Pat. Off. .
0157685  10/1985  European Pat. Off. .
2304177  10/1976  France .

OTHER PUBLICATIONS

IEEE Transactions on Microwave Theory and Technique, vol. MTT-29, No. 12, Dec. 1981, C. T. Rucker et al.: "Chip Level Impatt Combining at 40 GHz" pp. 1266-1271.
Patent Abstracts of Japan, vol. 6, No. 67 (E-104)(945), 28 Apr. 1982, & JP, A 5710259 (Hitachi Seisakusho K.K.) 19 Jan. 1982.

Primary Examiner—Robert S. Macon
Attorney, Agent, or Firm—Kenneth W. Float; A. W. Karambelas

[57] ABSTRACT

A technique is disclosed for making the high current-carrying electrical interconnections to the power FET devices in a synchronous rectifier circuit with extremely low lead resistance. All such interconnections are made with solder and pliable copper straps instead of by conventional wire bonds.

12 Claims, 4 Drawing Sheets

LOW RESISTANCE ELECTRICAL INTERCONNECTION FOR SYNCHRONOUS RECTIFIERS

BACKGROUND OF THE INVENTION

The invention relates to synchronous rectifiers, and more particularly to improved low resistance electrical interconnections for such rectifiers.

Synchronous rectifiers employing power field effect transistors as the rectifying elements are commonly used in applications such as power supplies, wherein substantial levels of current are provided. An example of one such power supply is described in the paper "The Design of a High Efficiency, Low Voltage Power Supply Using MOSFET Synchronous Rectification and Current Mode Control," by Richard Blanchard and Phillip E. Thibodeau, IEEE Power Electronics Specialist Conference, pages 355-361 (1985).

As semiconductor manufacturers improve (decrease) the "resistance-drain-to-source on" (RDS ON) of power FETs, the method of interconnection of the devices in the hybrid circuits becomes of critical importance. With the present state of the art, some power FETs have RDS ON values which are as low as 10 milliohms. Placing four devices in parallel reduces the effective RDS ON resistance of the circuit to 2.5 milliohms. However, at this level of resistance, the interconnection of the FET device to the package by conventional wirebonding techniques and the package to external circuits by conventional lead frame or pins introduces approximately 10 to 15 milliohms of resistance. This relatively high interconnect resistance introduces unwanted voltage drops, which produce additional heat that must be removed to maintain reliability. Further, the efficiency of the rectifier is reduced by such unwanted interconnect resistance. For example, assuming a total circuit resistance (resistance due to the circuit package, components and interconnects) of 12.5 milliohms, and a current level of 100 amperes, the circuit resistance leads to a voltage drop of 0.125 volts. Power lost in synchronous rectification is 12.5 watts.

There is accordingly a need for a means of interconnecting the FETs in a synchronous rectifier to reduce the packaging resistance to improve the efficiency.

It would further be desirable to provide a means of device interconnection in synchronous rectifiers which provides very low interconnect resistance.

SUMMARY OF THE INVENTION

A synchronous rectifier circuit device is disclosed with low resistance connections to the source and drain regions of the power transistors. A conductive substrate is soldered to the drain region of the power transistor, and the substrate is either soldered to the electrically conductive case in a "hot case" circuit or to a conductive layer bonded to a surface of the electrically non-conductive case in an isolated case circuit. Conductive tabs are soldered to the source bump contacts of the power transistor die. At least one feedthrough source connector is passed through the case so that a first end is adjacent the power transistor and a second end is exterior to the case. The interconnection to the source is formed by soldering one end of a conductive strap to the conductive tabs and the other end of the strap to the first end of the feedthrough connector. External source connections to the circuit may be made by soldering a conductor to the second end of the connector.

For a "hot case" synchronous rectifier circuit, the external drain connection may be made by soldering an external conductor to the conductive case. For an isolated case circuit, a second feedthrough connector is passed through the case, so that a first end is adjacent the conductive layer, and one end of a second conductive strap is soldered to the conductive layer, and the other end to the second feedthrough connector. The second end of the connector is located exterior to the case, and the external drain connection may be made by soldering an external conductor to the second end of the second connector.

BRIEF DESCRIPTION OF THE DRAWINGS

These and other features and advantages of the present invention will become more apparent from the following detailed description of exemplary embodiments thereof, as illustrated in the accompanying drawings, in which.

DETAILED DESCRIPTION

Figure 1:
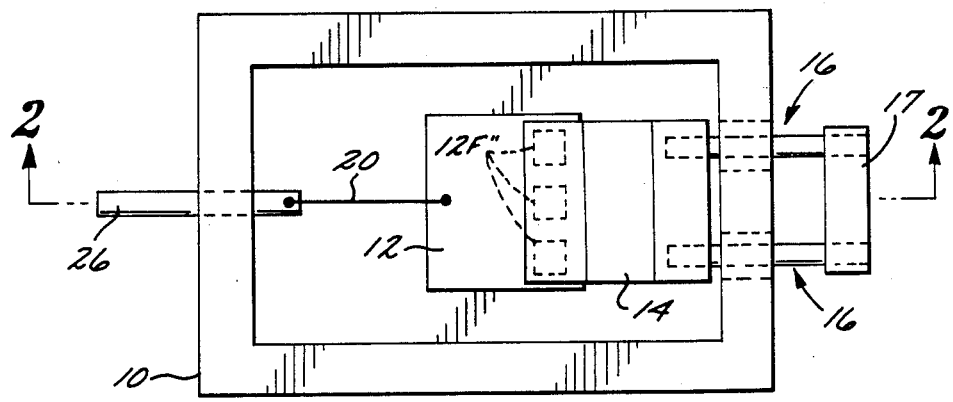
FIG. 1 is a top plan view of a portion of a first exemplary synchronous rectifier circuit employing the invention.
Figure 2:
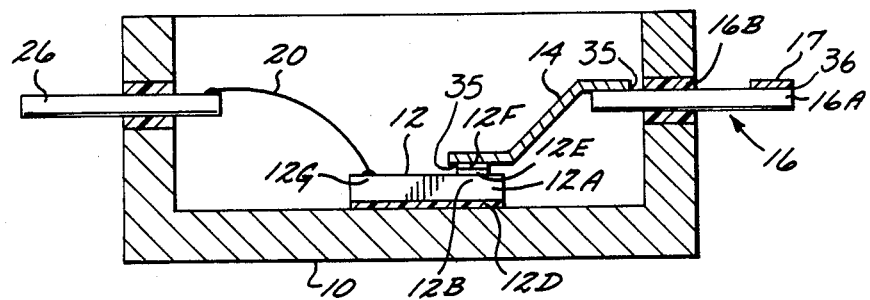
FIG. 2 is a cross-sectional view taken along line 2—2 of FIG. 1.

The present invention achieves the power connections to the source and drain of the power FET devices of a synchronous rectifier by solder and copper straps instead of by conventional wire bonding. A first exemplary embodiment of the invention is illustrated in FIGS. 1 and 2 with a "hot case" configuration of the synchronous rectifier, showing a top view and a cross-sectional view. As will be appreciated by those skilled in the art, electrical continuity is provided between the drain of the power FET device of the rectifier and the case of the rectifier in a "hot case" device. For the "hot case" configuration, the case 10 is fabricated from a material having high electrical and thermal conductivity, such as copper.

An exemplary power FET die 12 comprises a drain region 12A at the lower surface of the die which is secured by solder layer 13D to a surface of case 10. Thus, in this embodiment, the case 10 provides the electrical connection to the drain and enhances the thermal and electrical conductivity.

A source region 12B of the FET die 12 is provided with at least one, and preferably three in this embodiment, solderable bump contacts 12E. Die manufacturers typically provide source bump contacts that extend two mils above the top surface of the die. To extend the two mil thickness of the bump contacts, gold-plated or gold-clad molybdenum tabs 12F having an appropriate thickness of six mils are preferably soldered on the bump contacts 12E.

Two glass-insulated feedthrough connectors 16 are passed through openings formed in the side of the case 10 to comprise the circuit source connection to the FET die 12. The connectors 16 in this embodiment comprise a 40 mil diameter alloy or copper pin 16A supported within a glass insulator 16B. A gold-plated copper strap 17 is soldered (with high temperature solder indicated generally by reference number 36) across each of the pins 16A outside of the case 10 to electrically connect each pin 16A.

A gold-plated copper strap 14 is soldered at one end thereof to the pins 16A, and at the other end thereof to each of the tabs 12F (by solder connections indicated generally by reference numeral 35) to form a conductive path to the source region 12B of the FET die. In this embodiment, the strap 14 is 10 mils thick and 200 mils wide. An external connection to the FET die may then be made by soldering a conductor to the strap 17. The thickness of the tabs 12F and bump contacts 12E serve to elevate the strap 14 above the upper surface of the FET die 12.

In the past, source connections have been made to the FET die by conventional wirebonding to each of the source region contacts 12B. Thus, one strap 14 has replaced the three wire bonds.

A compliant interconnect is required to form the electrical connections to the FET wafer to prevent the solder joints from separating during temperature cycle testing of the circuit. The thermal coefficient of expansion of copper is sixteen (16) parts per million per degree Centigrade (ppm/°C.), compared to three (3) ppm/°C. for the silicon of the FET die 12; if the copper strap is too rigid, joint separation could occur. For the same reason, a soft solder such as indium-based solder should also be used to solder the strap 14 to the tabs 12F.

A wirebond connection may be employed to provide electrical connection to the gate region 12G of the FET die, since the gate connection carries only control signals, and not high current levels. A wire bond 20 provides electrical connection from the gate region 12G of the FET die, to a gate terminal feedthrough connector 26.

Figure 3:
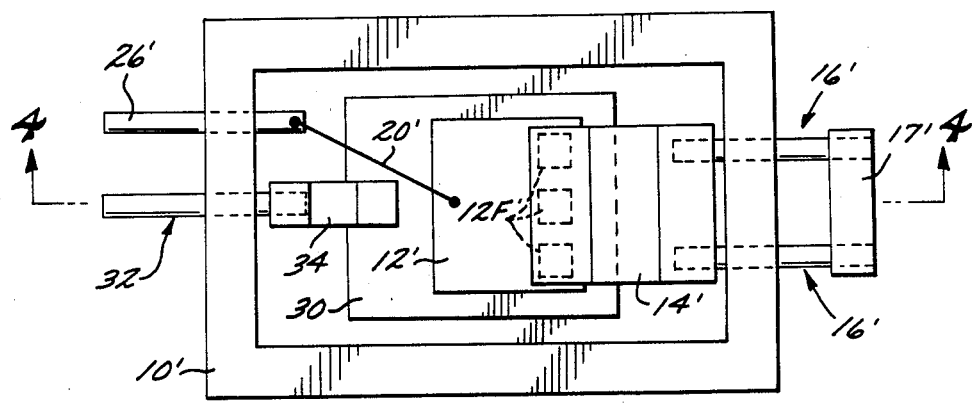
FIG. 3 is a top plan view of a second exemplary embodiment of a synchronous rectifier embodying the invention.
Figure 4:
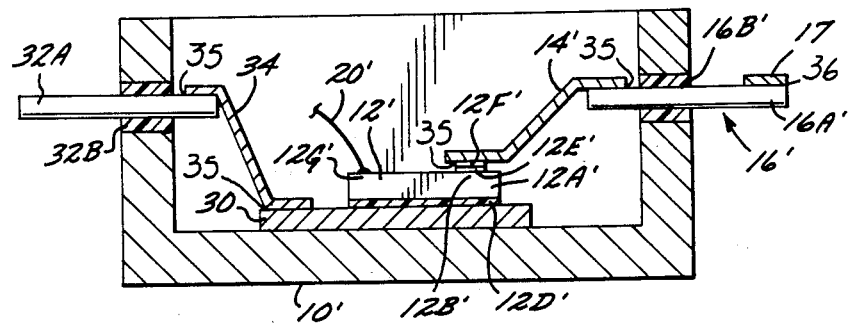
FIG. 4 is a cross-sectional view, taken along line 4—4 of FIG. 3.

Referring now to FIGS. 3 and 4, an alternate embodiment of the invention is disclosed for an "isolated case" synchronous rectifier circuit. As will be appreciated by those skilled in the art, for this embodiment the drain region of the FET device 12' comprising the rectifier circuit is isolated from the device case 10'. In the embodiment shown in the top and cross-sectional side views of FIGS. 3 and 4, the case 10' is fabricated from either a suitable insulating material such as beryllium oxide or conductive material such as copper.

A layer 30 is bonded to the case 10', and is fabricated from an electrically insulating material such as beryllium oxide or alumina. The top surface of the layer 30 is metallized with metallic layer 30A. An FET die 12' comprises a drain region 12A' at the lower surface of the die which is soldered to metallization substrate layer 12D'. The substrate layer 12D' is in turn soldered to the metallized top surface of the layer 30. The substrate 12D' is metallized to provide ultra-low resistivity; alternatively the substrate may be solder coated.

The electrical connection to the source bump contacts 12E' is made in a similar manner to that described above with respect to the embodiment of FIGS. 1 and 2, except that when the case 10' is nonconductive, the feedthrough conductive pins 16' do not require a separate insulator 16B; the pins 16' are fitted in bores formed through a side wall of the case 10'. Thus, a strap 14' is soldered to the tabs 12F' on the FET die 12', and to the pins 16'. An external circuit connection may then be made by soldering a conductor (not shown) to the strap 17'.

The drain connection for the embodiment of FIGS. 3 and 4 is made by soldering a gold-plated copper strap 34 to the metallized surface of layer 30 and also to feedthrough conductive pin 32. An external drain connection (not shown) may be made by soldering a conductor to the exposed surface of the pin 32 outside of the case 10'.

In the embodiment of FIGS. 3 and 4, the source and drain connections are indicated generally by reference numeral 35, and the high temperature solder connection to pin 16A' by reference numeral 36, as in the embodiment of FIGS. 1 and 2.

The gate connection to the gate region 12G' is made by the wire bond 20' to the feedthrough conductive pin 26' in the same manner as described above with respect to the embodiment of FIGS. 1 and 2.

Figure 5:
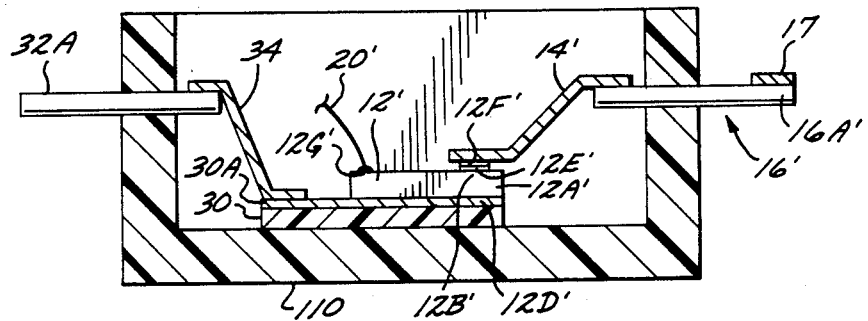
FIG. 5 is a cross-sectional view of the third exemplary embodiment of a synchronous rectifier embodying the invention.

FIG. 5 is a cross-sectional view of a third embodiment of a synchronous rectifier circuit embodying the invention. This embodiment is another "isolated case" circuit, and is similar to that shown in FIGS. 3 and 4 except that the case 110 is fabricated from a suitable insulating material such as beryllium oxide, and the conductive feedthrough pins therefore do not require separate insulators 16B' and 32B as shown in FIG. 4.

Figure 6:
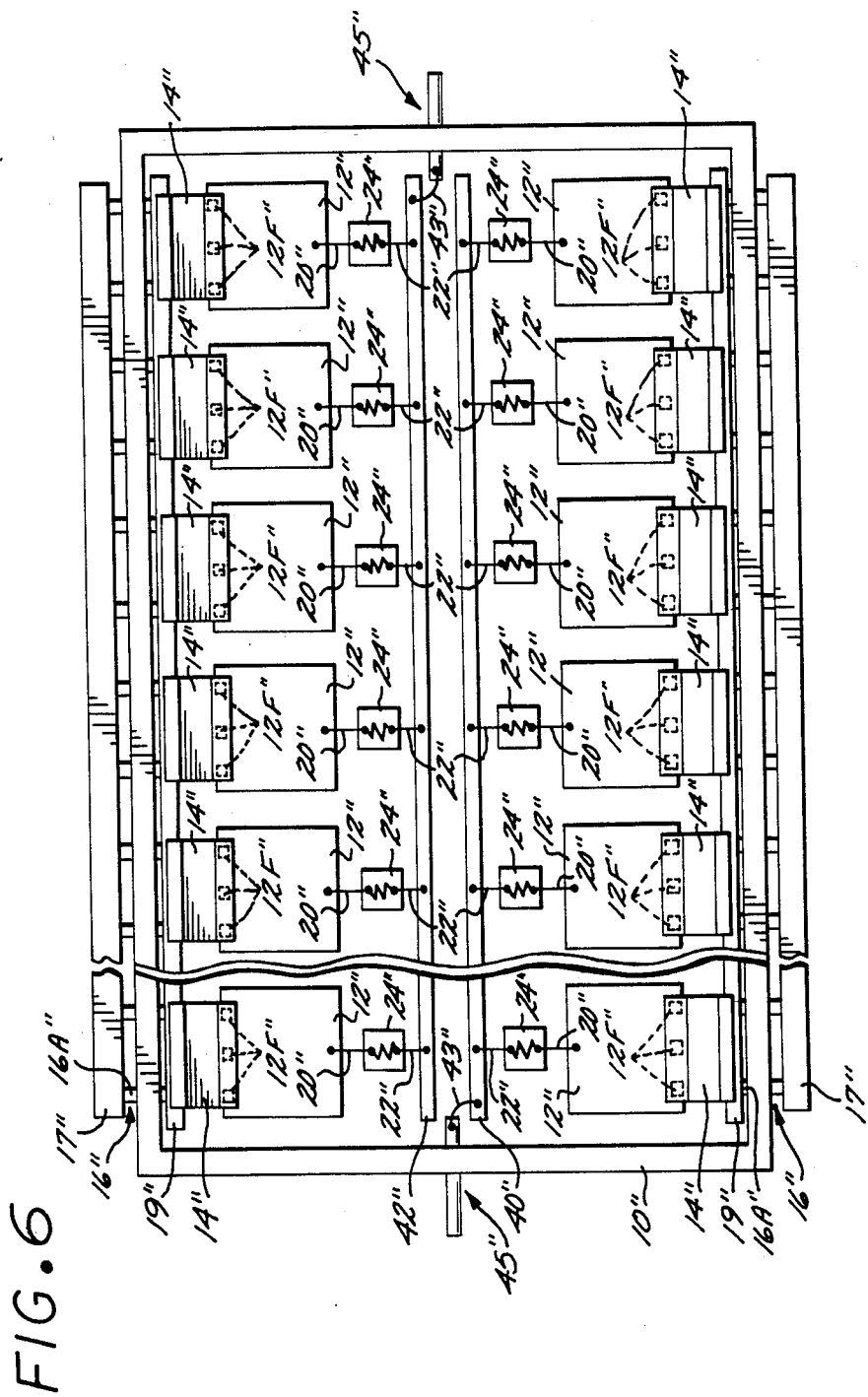
FIG. 6 is a top plan view of a fourth exemplary embodiment of a synchronous rectifier circuit employing a plurality of power FETs connected in parallel by an interconnect means in accordance with the invention.

A fourth embodiment of a synchronous rectifier circuit employing the invention is depicted in FIG. 6. This embodiment is of a "hot case" synchronous rectifier circuit employing a plurality of FET devices 12" arranged in two rows along facing sides of the case 10". The means for interconnection to the source regions of the FET device 12 of FIGS. 1 and 2 is replicated in the embodiment of FIG. 6 for each of the FET devices 12". Thus, each bump contact 12F'" for a particular FET device 12" is soldered to the corresponding source strap 14" for the FET devices 12". Each FET device 12" is provided with a corresponding pair of source feedthrough connectors 16". The sources of the FET devices 12" in each row are connected in parallel by a gold-plated copper strap 19", which is soldered to the upper surfaces of respective pins 16A" on the interior of the case 10". The straps 14" for the respective FET devices 12" in each row are in turn soldered to the upper surface of the strap 19". The strap 17" is soldered to the upper surface of each connector 16"; an external source connection (not shown) to the circuit may be made by soldering conductors to the straps 17" along the exterior of each side of the case.

The connections to the gate regions of each FET device 12" are made by conventional wire bonds 20" and 22". With the FET devices 12" connected in parallel, conventional resistive gate networks comprising thick or thin film resistors deposited on insulating substrates 24" are typically employed to prevent circuit oscillations. The resistor networks electrically couple the respective wire bonds 20" and 22". The wire bonds 22" are bonded to conductors 40" carried on insulator strips (not visible in the top view of FIG. 5). The conductor 40" for each row of FET devices 12" is connected by respective wire bonds 43" to gate feedthrough connectors 45". The external gate connections to the synchronous rectifier circuit may be made by connecting a conductor (not shown) to the connectors 45".

For the exemplary "hot case" embodiment of FIG. 5, the external drain connection to the FETs is preferably made by soldering a conductor (not shown) directly to the case 10".

A technique has been disclosed for packaging extremely low RDS ON power FETs in a synchronous rectifier circuit without introducing significant lead resistance. Circuit packages employing the invention have improved efficiency over circuit packages employing conventional wire bond interconnections for high current paths.

It is understood that the above-described embodiments are merely illustrative of some of the many possible specific embodiments which represent principles of the present invention. Numerous and varied other arrangements can readily be devised in accordance with these principles by those skilled in the art without departing from the spirit and scope of the invention.

What is claimed is:

1. A synchronous rectifier device comprising:
   an electrically conductive case;
   at least one power transistor having a drain region, a source region and a gate region;
   an electrically conductive substrate layer applied to said transistor in electrical contact with said drain region thereof, said substrate soldered to an interior surface of said case to secure said transistor to said case and form a low resistance electrical connection between said drain region and said case;
   means for forming an electrical interconnection to said gate region of said transistor; and
   means for forming a low resistance electrical connection to said source region of said transistor for carrying high current levels, said means comprising:
   (i) one or more solderable contact bumps extending from an exposed surface of said transistors in electrical contact with said source region;
   (ii) an electrically conductive member having first and second ends, said member passed through and electrically isolated from said case so that said first end is disposed within the interior of said case proximate to said transistor; and
   (iii) a pliable, electrically conductive strap having first and second ends, said first end soldered to said contact bumps and said second end soldered to said first end of said conductive member.

2. The device of claim 1 wherein said conductive strap is a gold-plated copper strap.

3. The device of claim 1 wherein said bump contacts are adapted to elevate said first end of said strap above said exposed surface to avoid contact with said surface.

4. A synchronous rectifier device comprising:
   a case member;
   at least one power field effect transistor having a drain region, a source region, and a gate region;
   a layer of electrically conductive material secured to an interior surface of said case;
   an electrically conductive substrate applied to said transistor in electrical contact with said drain region thereof, said substrate being soldered to said layer of conductive material;
   means for forming a low resistance electrical connection to said layer of electrically conductive material and for carrying high current levels;
   means for forming an electrical connection to said gate region of said transistor for carrying transistor control signals; and
   means for forming a low resistance electrical connection to said source region for carrying high current levels, said means comprising:
   (i) one or more solderable contact bumps extending from an exposed surface of said transistor in electrical contact with said source region;
   (ii) a first electrically conductive member having first and second ends, said member passed through said case so that said first end is disposed within the interior of said case proximate to said transistor; and
   (iii) a first pliable, electrically conductive strap having first and second ends, said first end soldered to said contact bumps and said second end soldered to said first end of said conductive member.

5. The device of claim 4 wherein said means for forming a low resistance electrical connection to said layer of electrically conductive material comprises:
   (i) a second electrically conductive member having first and second ends, said member passed through said case so that said first end is disposed within the interior of said case proximate to said transistor; and
   (ii) a second pliable, electrically conductive strap having first and second ends, said first end soldered to said layer of conductive material and said second end soldered to said first end of said second conductive member.

6. The device of claim 4 wherein said case member is fabricated from an electrically insulative material.

7. A power handling semiconductor device comprising:
   an electrically conductive case;
   at least one power transistor having a drain region, a source region and a gate region;
   an electrically conductive substrate layer coupled to said transistor in electrical contact with said drain region thereof, said substrate layer being soldered mechanically and electrically coupled to an interior surface of said case to secure said transistor to said case and form a low resistance electrical connection between said drain region and said case;
   means for forming an electrical interconnection to said gate region of said transistor; and
   means for forming a low resistance electrical connection to said source region of said transistor for carrying high current levels, said means comprising:
   (i) one or more solderable contact bumps extending from an exposed surface of said transistors in electrical contact with said source region;
   (ii) an electronically conductive member having first and second ends, said member passed through and electrically isolated from said case so that said first end is disposed within the interior of said case proximate to said transistor; and
   (iii) a pliable, electrically conductive strap having first and second ends, said first end soldered to said contact bumps and said second end soldered to said first end of said conductive member.

8. The device of claim 7 wherein said conductive strap is a gold-plated copper strap.

9. The device of claim 7 wherein said bump contacts are adapted to elevate said first end of said strap above said exposed surface to avoid contact with said surface.

10. A power handling semiconductor device comprising:
- a case member;
- at least one power field effect transistor having a drain region, a source region, and a gate region;
- a layer of electrically conductive material secured to an interior surface of said case;
- an electrically conductive substrate applied to said transistor in electrical contact with said drain region thereof, said substrate being soldered to said layer of conductive material;
- means for forming a low resistance electrical connection to said layer of electrically conductive material and for carrying high current levels;
- means for forming an electrical connection to said gate region of said transistor for carrying transistor control signals; and
- means for forming a low resistance electrical connection to said source region for carrying high current levels, said means comprising:
  - (i) one or more solderable contact bumps extending from an exposed surface of said transistor in electrical contact with said source region;
  - (ii) a first electrically conductive member having first and second ends, said member passed through said case so that said first end is disposed within the interior of said case proximate to said transistor; and
  - (iii) a first pliable, electrically conductive strap having first and second ends, said first end soldered to said contact bumps and said second end soldered to said first end of said conductive member.

11. The device of claim 10 wherein said means for forming a low resistance electrical connection to said layer of electrically conductive material comprises:
  - (i) a second electrically conductive member having first and second ends, said member passed through said case so that said first end is disposed within the interior of said case proximate to said electrically conductive material; and
  - (ii) a second pliable, electrically conductive strap having first and second ends, said first end soldered to said layer of conductive material and said second end soldered to said first end of said second conductive member.

12. The device of claim 10 wherein said case member is fabricated from an electrically insulative material.

* * * * *